United States Patent [19]

Desai et al.

[11] Patent Number: 6,011,873
[45] Date of Patent: Jan. 4, 2000

[54] METHOD AND APPARATUS FOR LOSSLESS COMPRESSION OF SIGNATURE DATA

[75] Inventors: Apurva Desai, Fremont; Abbas Rafii, Los Altos, both of Calif.

[73] Assignee: Penware, Inc., Sunnyvale, Calif.

[21] Appl. No.: 09/069,685

[22] Filed: Apr. 29, 1998

[51] Int. Cl.[7] ..................................................... G06K 9/36
[52] U.S. Cl. ........................... 382/245; 382/246; 382/119
[58] Field of Search ................................... 382/244, 245, 382/246, 238, 239, 119, 166; 358/261.1, 443; 341/59; 345/442; 705/2

[56] References Cited

U.S. PATENT DOCUMENTS

| | | | |
|---|---|---|---|
| 5,473,742 | 12/1995 | Polyakov et al. | 345/442 |
| 5,751,860 | 5/1998 | Su et al. | 382/244 |
| 5,796,864 | 8/1998 | Callahan | 382/166 |
| 5,805,303 | 9/1998 | Imaizumi et al. | 358/433 |
| 5,867,821 | 2/1999 | Ballantyne et al. | 705/2 |

*Primary Examiner*—Joseph Mancuso
*Assistant Examiner*—Vikkram Bali
*Attorney, Agent, or Firm*—Flehr Hohbach Test Albritton & Herbert LLP

[57] ABSTRACT

A signature capture device includes a CPU that executes a routine to losslessly compress signature data in realtime such that decompression recovers a legally acceptable replica of the original signature. Digital data representing the pixel start point of a signature run is stored in preferably 10-bit or 9-bit format, and is then reduced to a common lower format of 9-bit or 8-bits. Subsequent data points within a run are reduced to the same common lower format and are compared to the common lower format version of the start point data. The differential between the start point and the adjacent second point is calculated and encoded with 4-bits if possible, or with 8-bits otherwise. The differential between the third point and second point is calculated and encoded with 4-bits or 8-bits, as required, and so on, within the run. A run is initiated by a pen-down status, or if a present run exceeds a predetermined length, or if a differential can no longer be encoded with 4-bits and requires 8-bit encoding. For each run, the start position and differential pixel positions are encoded with a preferably 32-bit start block the provides pen-up and pen-down status (1-bit), run length (10 bit), encoding 4-bit or 8-bit status (1-bit) and up to 10 bits each for initial x and y pixel position. The routine is stored in device ROM or as firmware, and incoming data is CPU processed and stored in RAM for export as a compressed data stream.

20 Claims, 5 Drawing Sheets

METHOD AND APPARATUS FOR LOSSLESS COMPRESSION OF SIGNATURE DATA

FIELD OF THE INVENTION

This invention relates to touch pad devices that generate two-dimensional positional information when touched with a stylus as during signature writing, and more specifically to methods and apparatuses for losslessly compressing signature data written on such a touch pad.

BACKGROUND OF THE INVENTION

FIG. 1 depicts a device 10 that includes a signature touch pad 20 that generates x-axis and y-axis positional information in response to being touched with a stylus or pen 30 at one or more points on the pad. In some systems, stylus 30 is active, e.g., is coupled to a battery to present a potential or charge on touch pad 20. In other systems, stylus 30 is passive, e.g., is a plastic or wooded stick, and touch pad 20 responds to physical force exerted by the tip of the stylus.

Touch pad 20 may be opaque, but preferably includes a liquid crystal display ("LCD"). An LCD touch pad can display the point presently touched by the stylus, as well as the locus of preceding touched points, as the stylus was dragged across the touch pad. For example, in FIG. 1, a user's signature 40 has been written on touch pad 20 and is displayed by a LCD in real time, e.g., as the signature is made. Device 10 can also be used to draw sketches, or other information on touch pad 20. However, as used herein, the term "signature" will refer to a user's written signature.

Device 10 includes an analog-to-digital ("A/D") converter and stylus detect circuitry, collectively 50, that digitizes analog positional data into digital (x,y) signature positional data. Thus, signature 40 is represented as a collection of digital (x,y) coordinates. (For ease of understanding, the x-axis and y-axis are depicted on touch pad 20.)

Device 10 includes a central processing unit ("CPU") 60 that receives the digitized data as a data stream of (x,y) positional information, referred to herein as signature data. Device 10 also includes internal read only memory ("ROM") and random access memory ("RAM"), shown collectively as 70. The signature data is stored in RAM, and may be processed by CPU 60, using software routine(s) stored in ROM. Frequently, the signature data or processed signature data is transmitted to a host system 80 over a cable or wireless communication link 90.

Device 10 typically has other capabilities as well. For example, U.S. patent application Ser. No. 08/853,955, entitled MODULAR SIGNATURE AND DATA-CAPTURE SYSTEM AND POINT OF TRANSACTION PAYMENT AND REWARD SYSTEM (filed May 9, 1997 and assigned to assignee herein) discloses a particularly advanced signature capture device 10 and associated systems.

As generated, the data stream consists of a given number of bytes and is uncompressed. For example, in uncompressed form, each (x,y) position point may comprise 4-bytes total, and the locus of positional data representing signature 40 may comprise a total of T bytes, uncompressed. However, to reduce RAM storage requirements, it is known in the art to store in ROM a data compression routine. Such a routine is executed by CPU 60 to compress the data stream, such that a signature (or image) requiring T bytes of storage in uncompressed format can now be stored in K×T bytes, where K<1. The compression ratio represents the numerical reduction in size of the original data set. Thus if K=0.25, a 1000 byte data set may be reduced to 250 bytes upon compression, and the compression ratio is four.

The compressed data set eventually will be decompressed, perhaps by a CPU within host system 80 that executes a software decompression program stored within system 80. Ideally, the decompressed data represents an original data set that would have been stored had no compression being employed on the signature data stream.

For example, device 10 may be used in commercial transactions to facilitate credit card payment by users, perhaps at a grocery store. Host system 80 may, for example, store (compressed or uncompressed) a library of known genuine signatures for many users, including a true exemplar of signature 40. At time of payment at the grocery store, a user presenting a credit card will create signature 40 on device 10. Understandably, if the credit card is stolen, the user will not be able to create a genuine signature 40, only a forgery.

The signature data corresponding to signature 40 is transmitted typically in compressed form to host system 80. Host system 80 decompresses the signature data and compares the uncompressed data to previously stored data for the genuine signature for the user in question. Based upon the comparison, host system 80 communicates to the merchant at the point of transaction, often via link 90 and device 10, whether signature 40 is genuine or an apparent forgery. If genuine, the transaction proceeds, and if a potential forgery, the user will be asked for further identification, or to re-sign the signature, or the credit card being used may be confiscated.

Although adequate image resolution exists in the original signature data set, some resolution may be lost during compression. Because some data is thus lost, it may not always be possible to restore a faithful reproduction of the original sized signature. As a result, a decompressed reproduced signature can appear jagged and will may create verification problems when compared with the original signature.

Understandably, verification use of compressed signature data requires that when uncompressed, the original signature may be recovered with minimal distortion. However, so-called lossy compression techniques distort the original form of the signature data in the process of attempting to reduce the storable byte size. As a result, the original data set cannot be faithfully recovered or extracted from a lossy compressed data set. By contrast, lossless compression does not distort the original form of the data, and permits the original data set to be faithfully extracted using appropriate decompression techniques.

For example, U.S. Pat. No. 5,473,742 to Polyakov 1995) discloses a compression algorithm that provides a compression ratio of nine. The Polyakov algorithm smoothes sharp curves and sudden changes in a signature, e.g., high frequency signature components. But this compression technique cannot distinguish between deliberate sharp curves in a signature, as opposed to sharp-appearing curves that are introduced by the digitizing process. For example, the genuine signature of an user-signer inflicted with palsy may include jittery lines. Unless a decompressed version of the genuine signature reproduces the jittery lines, verification is difficult. Such a signature would not fare well when compressed using the Polyakov method. Further, the Polyakov method is rather slow, taking typically many seconds to compress a signature.

Smoothing and filtering techniques are known in the art to remove compression-induced distortion and jaggedness. However, the use of such techniques should be minimized to reduce the risk of altering the original form of the signature in a significant manner. Further, in the case of a palsied user's signature, such smoothing signal processing would be counter-productive.

To summarize, when used to verify signatures for commercial or other legally binding transactions, it is important that device 10 or host system 80 be able to faithfully reproduce a high resolution image of a signature from compressed data. The original signature data should not be altered, which is to say that compression should be lossless, not lossy. Further, in a legally binding transaction, it is highly desirable to retain the original form of the signature for verification purposes.

Thus, there is a need for a compression technique that can rapidly handle a large volume of signature data, without altering the original form of the signature data. Such a compression technique should therefore be lossless, should provide a good compression ratio without introducing distortion, and preferably should be rapidly executable. Further, such a compression technique should provide a simple, preferably transparent, user interface.

The present invention provides such a compression technique and a device for implementing such compression.

SUMMARY OF THE PRESENT INVENTION

A signature capture device includes a pressure sensitive pad comprising pixels whose (X,Y) position points are contacted by a stylus or pen in a pen-down status, to create a signature. The present invention provides lossless realtime compression of resultant signature data by digitizing pen-down generated pixel data into high resolution position data (e.g., 10-bit) for the starting (X,Y) point for a data run. This initial start point data is then reduced in resolution to a user-selected 8-bits or 9-bits. The second and subsequent data points within a data run are all reduced to the same user-selected 8-bits or 9-bits.

Within a data run, the second data point is compared to the first data point (each in 8-bit or 9-bit common lower resolution) and a differential or offset is calculated and stored. If the offset can be encoded in 4-bits it is so encoded, otherwise the offset is encoded in 8-bits. The third data point is then compared to the second data point in the same manner, and so on for all data points within a run.

Pen-up status typically implies the pen has been moved to a new location on the pressure pad, and the current continuous run of signature data is interrupted. A new run begins with a new pen-down condition, or when the previous run exceeds a predetermined length, e.g., >10 bits. A new run can also be required if currently generated data requires encoding with more bits than are currently being used (e.g., 8-bit encoding rather than 4-bit encoding).

A preferred format for the compressed output data stream includes one bit denoting pen-up/pen-down status, 10-bits denoting run length, one-bit denoting 4-bit or 8-bit encoding, 10-bits for y-pixel location, and 10-bits for x-pixel location. Thus, each point in a run is stored as a 4-byte pack with a unique 4-byte pen-up location, in which every pen-up status is explicitly indicated.

Lossless compression is thus achieved by storing the run starting point position in higher resolution format, and then reducing all data points to a lower 8-bit or 9-bit resolution. Differential data positions are determined and stored relative to the previous data point in a run, and are encoded in a low (e.g., 4-bit) or higher (e.g., 8-bit) format. Adjacent data points that are sufficiently close to each other can have their differential offset encoded in the lower (e.g., 4-bit) resolution format, thus saving storage. In this fashion, essentially only duplicate data points are discarded, and a rapidly executing lossless compression with a good compression ratio is attained. Decompression essentially reverses the steps used to compress the signature data and can recover the original signature data with no or acceptably low distortion. The decompressed data provides a legally recognizable and acceptable signature, useful for identification verification, among other purposes.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 1:
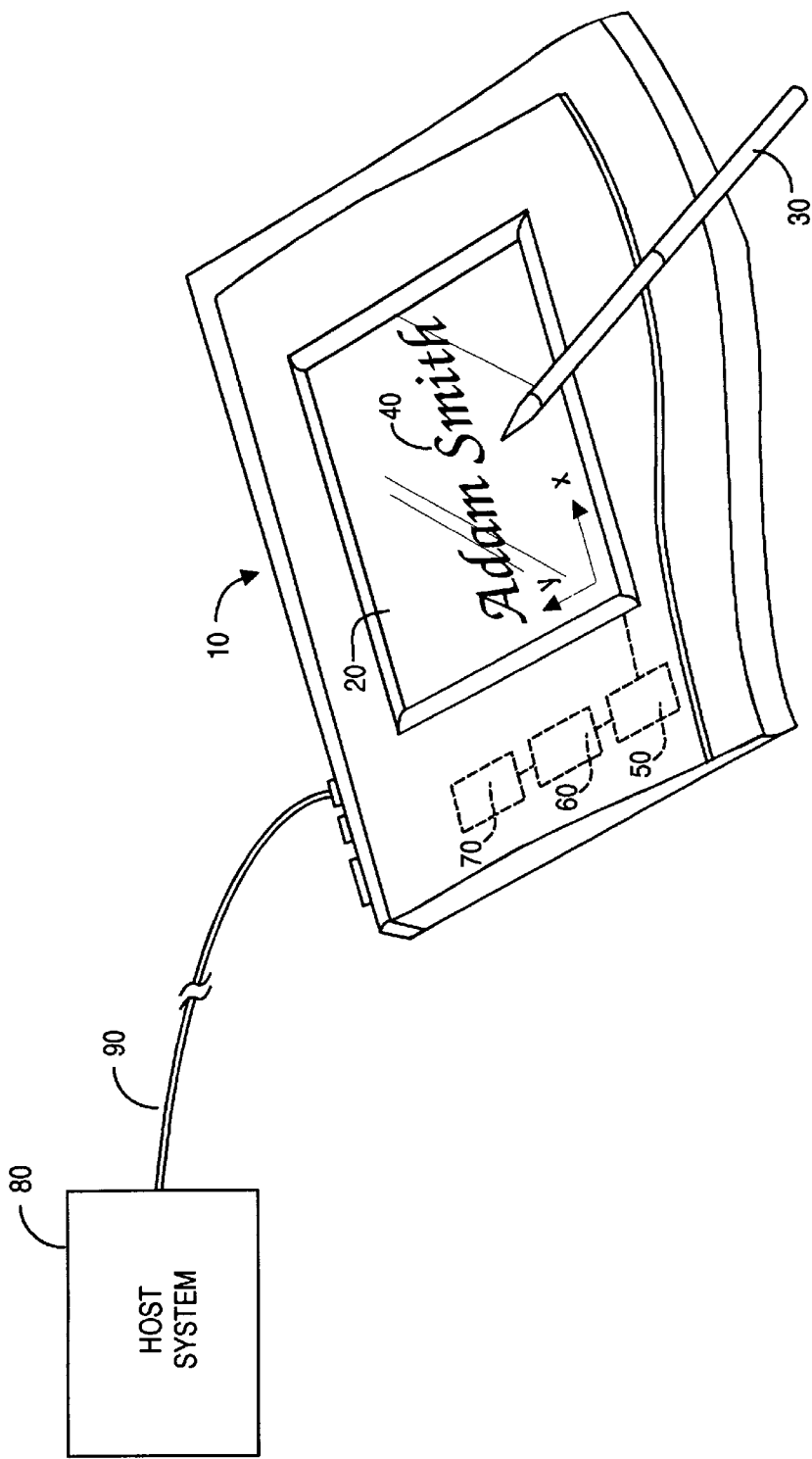
FIG. 1 is a perspective view of a signature capture device, with which the present invention may be practiced.
Figure 2:
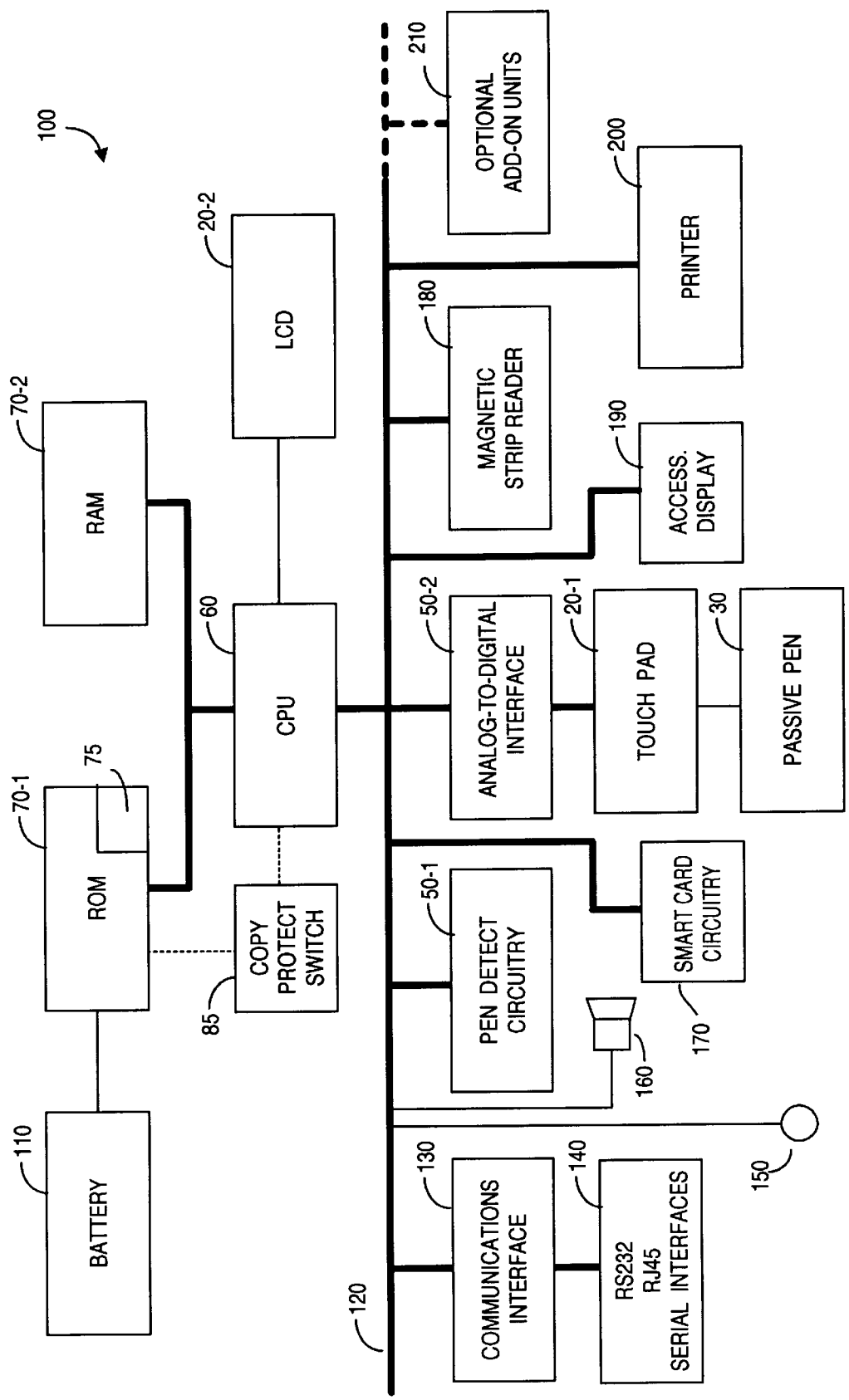
FIG. 2 is an architectural block diagram for a signature capture device, according to the present invention.

FIG. 2 is a block diagram depicting preferred architecture 100 for a device such as unit 10, although the present invention may be practiced with other architecture instead. Reference numerals in FIG. 2 identical to numerals used in FIG. 1 may refer to the same unit or subunit. Note that what in FIG. 1 was denoted as pressure pad/LCD unit 20 is shown in FIG. 2 as touch pad 20-1 and LCD 20-2. In terms of signal processing, signals associated with units 20-1, 20-2 may be handled differently, but from a user's perspective these two units appear to function as a single module 20.

As noted, the pressure pad acts as a writing surface upon which a user may write a signature (or other graphics), preferably with passive pen 30. As a user writes, pressure sensitive sensors within touch pad 20-1 respond to user-drawn positions of the stylus or pen. Touch or pressure pad 20-1 preferably provides raw 12-bit pixel resolution, e.g., 4096×4096 pixels. Thus, X-axis and Y-axis coordinate values of points within a signature may vary from 0 to 4096.

In a modern signature capture device such as the PenWare 3000, manufactured by PenWare of Sunnyvale, Calif., device 10 may include a zooming engine, back lighting, and a preferably VGA-caliber LCD screen. (The resolution of the LCD screen typically is less than the data capture resolution of the pressure pad.)

An analog-to-digital (A/D) interface 50-2 converts the analog pen position to the high resolution (e.g., 4096 values) x-axis, y-axis coordinates of the touch pad. In the present invention, pen-drawn pressure coordinates for a signature are signal compressed and buffered within unit 10 before transmission to host system 80.

Architecture 100 includes a preferably industry standard architecture ("ISA") bus 120, which is drawn with bold lines in FIG. 2. Bus 120 is used by the A/D interface unit and other units to couple information within unit 10. For example, pen detection circuitry 50-1 receives, via bus 120, A/D pressure pad coordinate data from A/D unit 50-2. In this manner, device 10 can identify a pen-down (e.g., start of writing upon the touch pad) as opposed to a pen-up (e.g., no contact on the pressure pad from pen 30) status, as well as the locus of user-drawn points. Display data for LCD 20-2 preferably is output directly by CPU 60.

In the preferred embodiment, system 100 operates under control of an embedded microprocessor (CPU) 60, e.g., an x86-compatible processor operating at 16 MHz clock frequency. In devices such as the PenWare 3000, software support is provided for MS DOS/Windows 95, Windows 3.1 and Windows NT platforms.

In FIG. 2, read only memory (ROM) 70-1 includes a software routine 75, preferably implemented as part of system 10 firmware, that upon execution by CPU 60 provides realtime data compression, according to the present invention. ROM 70-1 may be a 256 KB EPROM unit, although other ROMs may instead be used. In addition to providing on-the-fly data compression, software or firmware 75 may also be used to encrypt a user's personal identification number (PIN), and can control operation of any peripheral or optional attachments 210 coupled to unit 10.

Volatile random access memory (RAM) 70-2 (preferably 256 KB) provides in-system memory to maintain data including encryption key, custom stored signatures, and customized displayable logos. RAM 70-2 may also store signatures that have been encoded or compressed by routine 75, for transmission to host system 80 (or elsewhere). As shown in FIG. 2, communications between CPU 60, ROM 70-1, and RAM 70-2 are via ISA bus 120. Device 10 is powered by battery 110, which also backs-up contents of RAM 70-2. In sophisticated units 10 such as the PenWare 3000, a copy protection switch unit 85 enables CPU 60 to securely protect encryption key data and to protectively erase such data automatically if an attempt is made to open the housing of device 10.

Ideally, device 10 includes serial communications interfaces 130, 140 that can provide communication between unit 10 and a host system 80. Host system 80 may include a full server-type computer system and typically is located off-site from the point of transaction whereat unit 10 is used. Device 10 typically includes additional I/O ports such as port 150, a sound transducer 160, and provision for coupling to an accessory display 190 and to an external or built-in printer 200. Device 10 preferably further includes a built-in magnetic stripe reader (MSR) 180 to read identification and other data encoded on at least two magnetic tracks on credit cards and the like. Preferably device 10 can read and encrypt personal information number (PIN) data entered using a PIN pad accessory unit 210, or via soft LCD-displayed keys, or the like.

Figure 3:
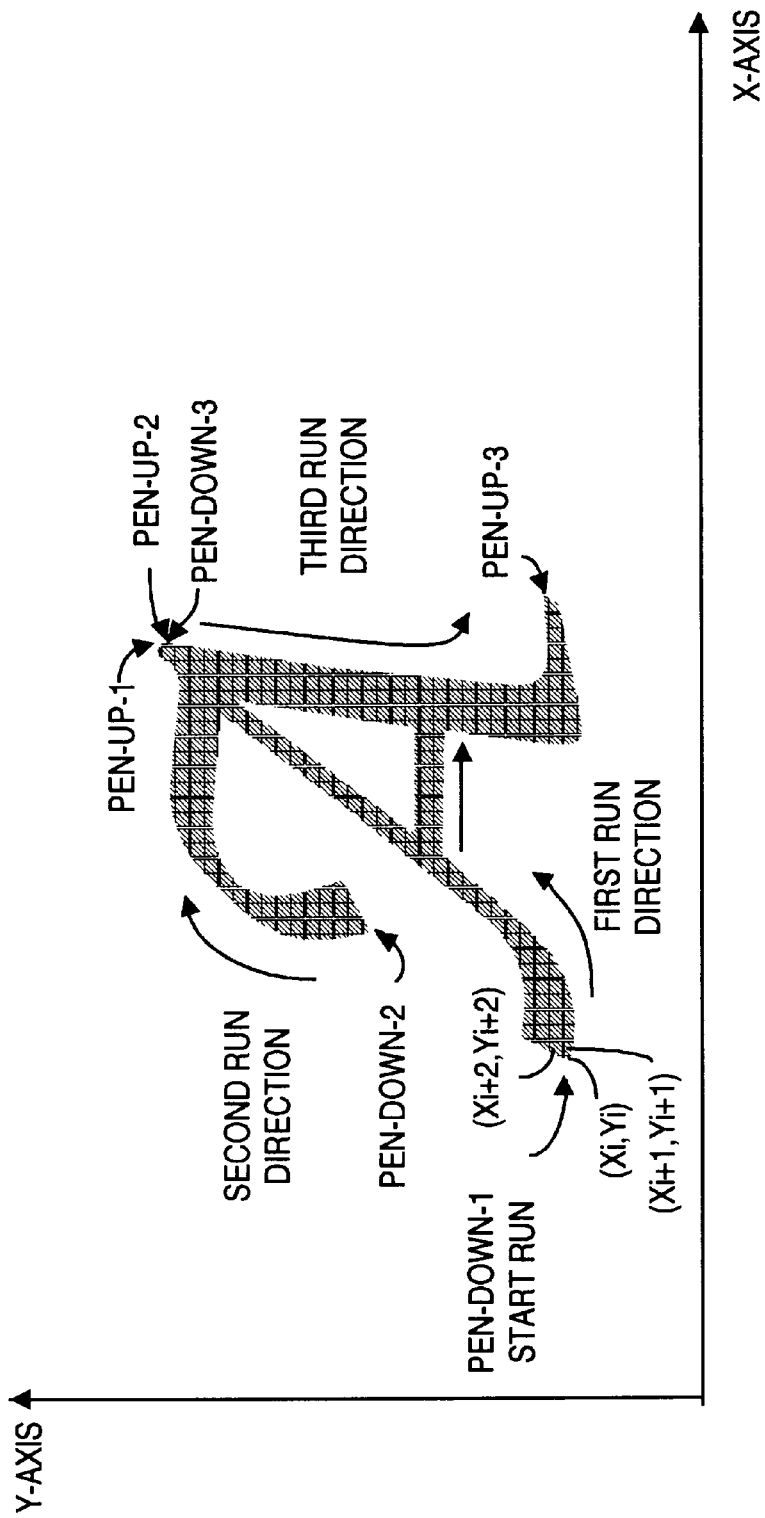
FIG. 3 depicts a pixel-version of a letter in a signature, showing nomenclature for pixel location, pen-up and pen-down, and start and end of runs, according to the present invention.

Having generally described the architecture preferably found in a modern signature capture device, nomenclature used in the present invention will be described with respect to FIG. 3. FIG. 3 shows a portion of a writing, for example, the first letter "A" in the name Adam Smith, as written on the touch pad in FIG. 1. The letter "A" is depicted as a group of rectangular pixels, e.g., some of the 4096×4096 pixels that comprise the entire writing surface of the touch pad. Understandably, the letter "A" shown might use only 10% of the total pixels, if the entire signature is "Adam Smith".

Before the pen 30 contacts touchpad 20-1, the pen status is said to be pen-up. When touchpad contact is made, the pen status is said to be pen-down. Assume in FIG. 3, that a writer creates the letter "A" by making first contact ("pen-down") where indicated by pen-down-1 start run. While maintaining a pen-down status, the writer moves the pen upward and to the right, as shown by the first run direction arrow, to draw the left portion of the letter "A". At the top of the letter "A", the writer lifts the pen (pen-up 1, in FIG. 3). Typically, a pen-up status implies that the pen has moved to a new location on the signature pad, and that the current continuous run of signature data is interrupted.

Assume that the writer now places the pen down (pen-down) at the location shown in FIG. 3 as pen-down-2. The writer now draws the decorative left-to-right curve that joins the top of the letter "A", lifting the pen at the pen-up-2 location. The locus of pixels traversed in making this curve is shown and denoted as the second run, which is terminated by the pen-up status at the pen-up-2 location. The writer then contacts the touch pad at the top of the "A" at the pen-down-3 location and makes the right-hand side of the "A", denoted as third-run, and then lifts the pen at the pin-up direction. The writer may then chose to make the horizontal line in the middle of the "A", sweeping left-to-right (or vice versa), as a fourth run.

At the very first pen-down location, e.g., the start of the first run, the first pixel contacted (the start data point) is denoted as having coordinates (Xi,Yi), for example decimal values (4000,4000). As the first run is made, the next adjacent pixel to receive pen pressure will have coordinates ($X_{i+1}, Y_{i+1}$), for example decimal values (3000,3000). As these first two pixels do not necessarily coincide, the second pixel may be referenced to the first pixel in terms of a differential distance therefrom, e.g., a vector given by ($X_{i+1}-X_i$, $Y_{i+1}-Y_i$). If the pixels coincide, the differential distance is zero, as the points are duplicative.

In overview, the present invention stores the initial start data point in high (preferably 10-bit) resolution. This start data point and all subsequent data points within a run are then reduced to a same or common lower resolution format. In the preferred embodiment, the common lower resolution format was 9-bit or 8-bit.

Within a run, each ($X_{i+1}, Y_{i+1}$) position in the common lower resolution format is encoded with respect to a previous (X,Y) position. Thus, if positions ($X_i, Y_i$) and ($X_{i+1}, Y_{i+1}$) are adjacent points (represented in the common 8-bit or 9-bit lower resolution format) within the same pen down run, it is understood that the data stored and encoded for ($X_{i+1}, Y_{i+1}$) will be ($X_\Delta, Y_\Delta$), where:

$$X_\Delta = (X_{i+1}) - (X_i)$$

$$Y_\Delta = (y = Y_{i+1}) - (Y_i)$$

As the first run continues, the next pixel traversed (signature data point three) has coordinates ($X_{i+2}, Y_{i+2}$), for example digital values (2000,2000). This data is reduced to 8-bit or 9-bit resolution (as are other data points in the run), and this pixel is referenced by a vector offset from the second pixel, the offset being ($X_{i+2}-X_{i+1}$, $Y_{i+2}-Y_{i+1}$).

As will be described herein in greater detail, the present invention encodes and stores the differential offset values in one of two lower resolution formats. If the offset is sufficiently small, 4-bit format is used to encode and store the offset, but if the offset is too large to be encoded using only 4-bits, then a higher resolution 8-bit format is used. In this fashion, adjacent data points that are sufficiently close together have their offset position (relative to a previous data point) stored and encoded using fewer data bits than would otherwise be used.

Every new pen-up status can end a data run, and every pen-down status can start a new run, typically at a new starting point. Thus, at pen-up, one data run stops, and at the next pen-down, a subsequent data run commences. As will be described with respect to step 330 in FIG. 4, other conditions besides a pen-up and then pen-down status can also initiate a new start run.

Figure 4:
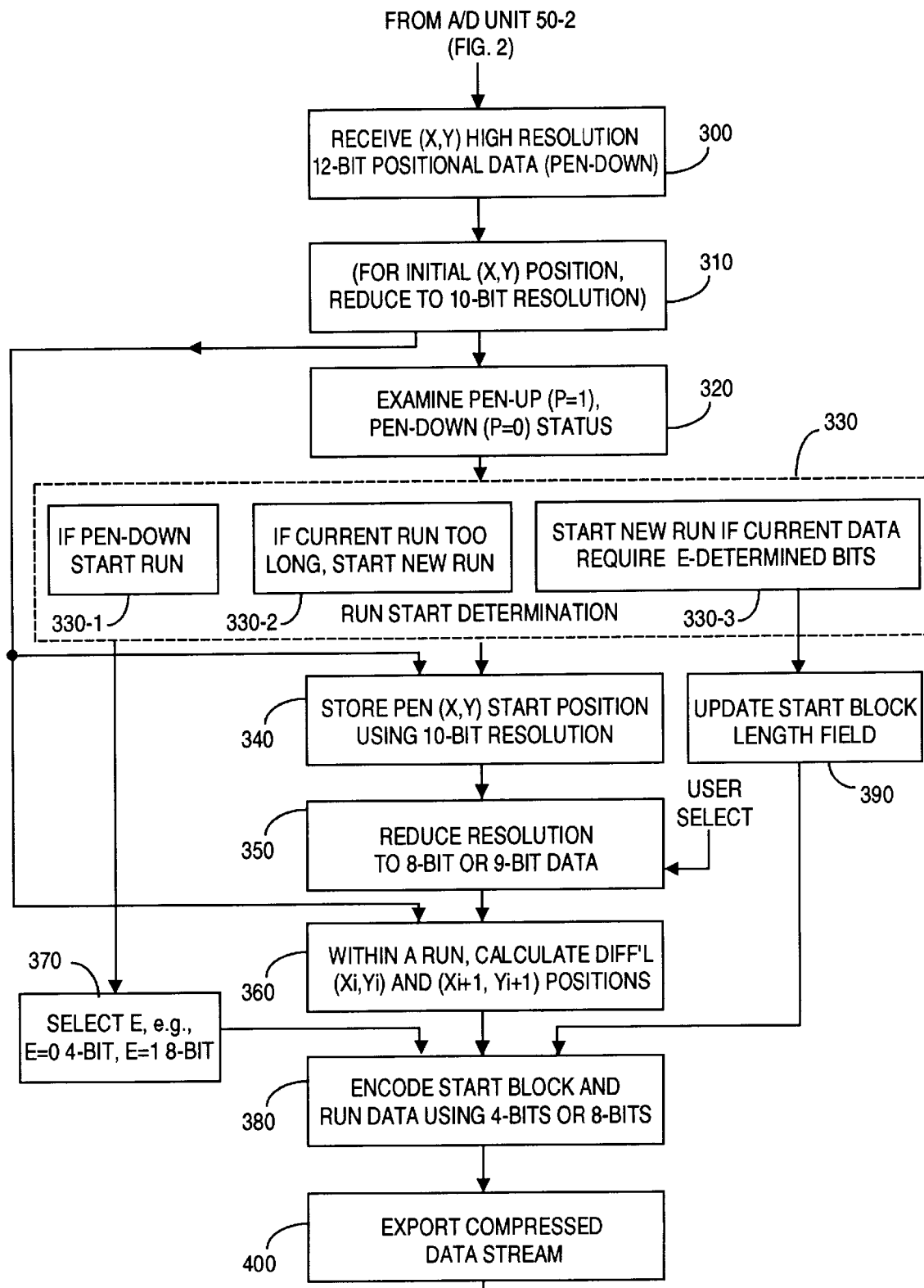
FIG. 4 is a block diagram depicting realtime data compression, according to the present invention.

FIG. 4 is a flow chart depicting steps implemented by software routine 75, upon execution by CPU 60 within device 10 (see FIG. 2). By way of example, consider the following raw data set of the first four location pixel points in a signature. This raw data will have been output from touch pad 20-1 and A/D unit 50-2, typically in 12-bit resolution.

| POINT NO. | DECIMAL | HEX | BINARY |
| --- | --- | --- | --- |
| 1 | (4000,4000) | FA0 | 1111 1010 0000 |
| 2 | (3000,3000) | BB8 | 1011 1011 1000 |
| 3 | (2000,2000) | 7D0 | 0111 1101 0000 |
| 4 | (1000,1000) | 3E8 | 0011 1110 1000 |
| 5 | (500,500) | 1F4 | 0001 1111 0100 |

In FIG. 4, at method or process step 300, raw digitized (X,Y) positional data is received at high resolution from A/D unit 50-2. This incoming raw data is presented in response to pen-down status and pen movement against pressure pad 20-1, determined at method step 320. At method step 320, software routine 75 examines the pen-up or pen-down status of the stylus, for example, by determining whether any pixel on the pressure pad is being subjected to pressure at this time. In the preferred embodiment, pen-down status is denoted by a P=0 bit, and pen-up status is denoted by a P=1 bit (see FIGS. 5A, 5B). If pen-down status is determined, step 320 sets the pen status bit to P=0, and at step 330, a run is commenced.

On a modern signature capture device such as the PenWare model 3000 with which the present invention preferably is practiced, raw X-axis and Y-axis positions are each representable in high resolution format using 12-bits. Thus, resolution of the incoming signature raw data stream from A/D converter 50-2 is $2^{12} \times 2^{12}$, 4096×4096 bits. Of course other pressure pad and A/D units might output raw data having a different resolution. That this high resolution raw 12-bit data exceeds the LCD display resolution is relatively unimportant.

Figure 5A:
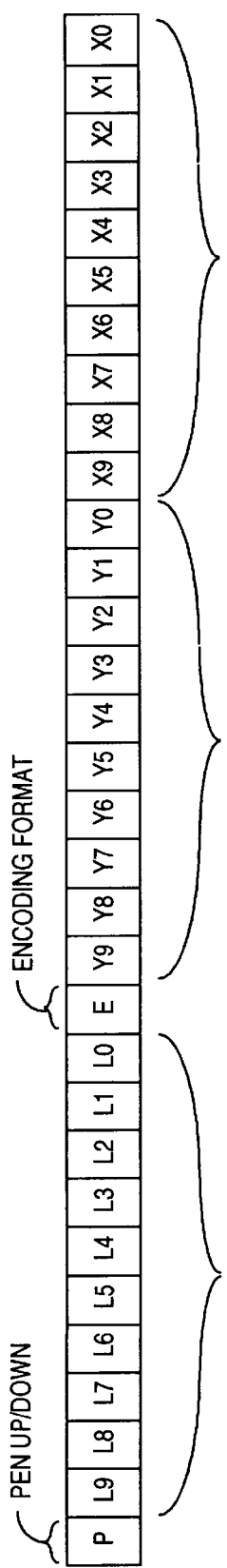
FIG. 5A depicts a preferred start block encoding format, according to the present invention.

As a design choice the raw 12-bit start point data (e.g., point 1, which is 1111 1010 0000) received at step 300 is reduced to 10-bits (e.g., 0011 1110 1000) at method step 310. At method step 340 the 10-bit data 0011 1110 1000 is stored in memory, preferably RAM 70-2. Referring to FIG. 5A, the initial start data for the Y-axis is denoted Y0, Y1, . . . Y9, and the initial start data for the X-axis is denoted X0, X1, . . . X9. The start point data reduction in resolution from 12-bits to 10-bits (or perhaps 9-bits) was implemented solely because only 10-bits of storage was available for the starting (X,Y) data point in the preferred embodiment. As shown in FIG. 5A, thus limiting the stored initial start values to 10-bits ensured that a 32-bit start block packet format could be attained.

Figure 5B:
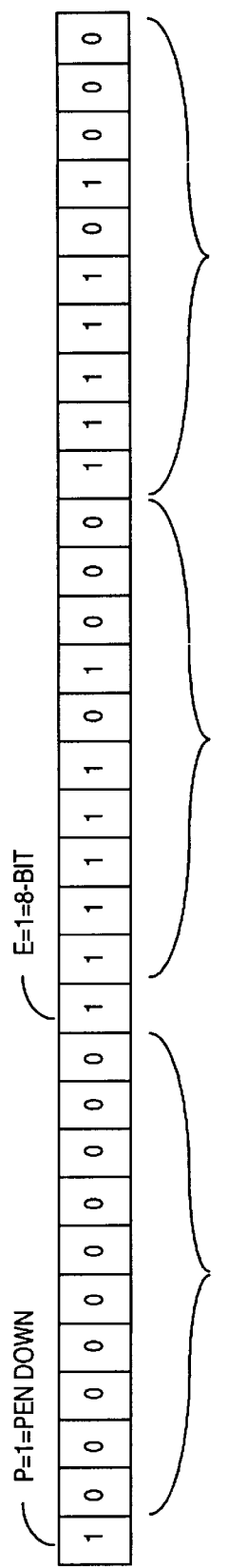
FIG. 5B depicts an exemplary encoding sequence for a start block, according to the present invention.
Figure 5C:
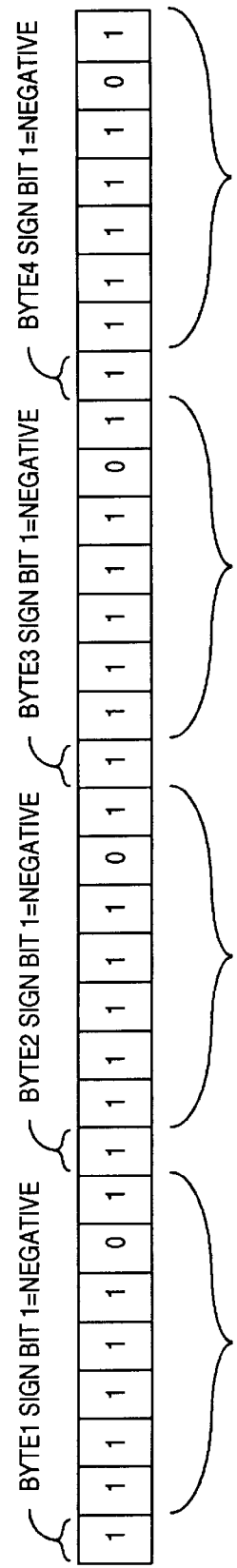
FIG. 5C depicts an exemplary run encoding sequence, according to the present invention.

FIG. 5B depicts the actual encoded start block for the exemplary data described above. According to the present invention, a 16-byte header as defined herein by FIG. 5A and as exemplified by FIG. 5B is appended as the first 16-bytes of any no-loss compressed signature data. FIG. 5C depicts bytes actually encoded in the run of no-loss compressed signature data comprising the exemplary data. As noted, FIG. 5C includes direction bits showing the positive or negative direction associated with a differential offset, and also includes the differential position bits for bytes in the run. In this example, the compressed pattern will be 80, 1F, A3, F8, 7D, 7D, 7D, 7D . . . (hex).

As a practical matter, if greater than 10-bit storage were available, then more than 10-bits could advantageously be used and stored at step 340. If necessary, 9-bit resolution instead of 10-bit resolution could be used for the start data at step 310 and step 340, again as a matter of system design. Nine-bit resolution would introduce some distortion but would produce a higher compression ratio. Accordingly, parentheses are shown around step 310 in FIG. 4 to denote that the present invention does not require resolution reduction at this juncture. Resolution reduction occurs at step 340 solely for practical storage constraints found in the preferred embodiment.

The step 310 bit-reduction of the starting point data is tantamount to right-shifting the 12-bit value 1111 1010 0000 by 2-bits, which is effectively dividing by four. Thus, the original X-axis or Y-axis raw 12-bit value of 4000=FAQ= 1111 1010 0000 after a 2-bit right shift becomes a 10-bit number 1000=3E8=0011 1110 1000 at step 310. It is these 10-bit numbers that are stored at method step 340 for the initial X-axis and the initial Y-axis start data location.

The initial 10-bit value stored at step 340 is then reduced at step 350 to a user-selected common lower resolution value, preferably 9-bits or 8-bits. The user selection of 9-bits or 8-bits is constant (or common) for an entire signature, which may of course comprise several data runs. Typically, 9-bit resolution will be used for signatures on legal documents, whereas 8-bit resolution will provide a better compression ratio but at the loss of some quality in the decompressed signature. The selection of 8-bit or 9-bit resolution at step 350 may be made as a software menu selection, or could be implemented using a switching device. In any event, within a signature, all subsequent data points are also reduced at step 350 to the same common 9-bit or 8-bit lower resolution format. Assume in the present example that the common lower resolution format is 9-bits.

Thus, at step 350, the 10-bit resolution starting point data is reduced down to 9-bits (since 8-bit common lower resolution format was not selected for the run). The 9-bit version of the original (12-bit raw) data 4000 becomes 500 (decimal)=1F4 (hex)=0001 1111 0100 (binary). Effectively, the 9-bit shift of the start point data is for purposes of differential comparison to subsequent data points in the run, which subsequent data points will also have been reduced to 9-bit (or 8-bit) resolution.

In the present example, the second data point in the run was (in raw form) 3000,3000=BB8 (hex)=1011 1011 1000 (binary). At step 350, this second point data (and subsequent data in the same run) is reduced down to 9-bits.

At 9-bit resolution, the second point value is 375 (decimal)=177 (hex)=0001 0111 0111 (binary).

At method step 360, the common lower resolution format versions of the starting point data and the second point data are compared and a difference or differential between these numbers is calculated. Comparing the common lower resolution format versions of the first and second data points yields (500–375)=125 (decimal).

The method now determines whether this differential (125) can be represented using 4-bit resolution, or whether 8-bit resolution is required. A 4-bit format (e.g., 4 bits for X, 4 bits for Y) can encode a differential position of up to 7 pixels ($2^3$) in both X-axis and Y-axis directions, with 1-bit ($2^1$) used for relative position of a present point with respect to an immediately preceding position point, e.g., direction.

A differential position that exceeds 7 pixels but is less than 127 pixels may be encoded using 8-bit format (e.g., 8 bits for X, 8 bits for Y). In 8-bit format, preferably 7 bits encode $2^7$ or 128 positions, and 1-bit encode relative position.

In the present example, the differential of 125 (decimal) =7D (hex)=1111101 (binary) between the third and second data position points requires representation using 8-bits. Accordingly at method step 370, a differential resolution bit (E) is set, in this case E=1 to represent 8-bit resolution, or more generally N-bit resolution. If the differential between data points were sufficiently low to permit encoding with 4-bit resolution (or more generally, M-bit resolution), step 370 would set E=0. During compression of signature data, the E bit can change on-the-fly to reflect 4-bit or 8-bit encoding format, as required, but method step 330-3 will commence a new run with a change in the value of E.

The above method steps are repeated to calculate and encode the differential between the third data point and the second data point in the run. Again, each data point being compared at step 360 having been reduced at step 350 to the common lower resolution format, 9-bits in the present example. In raw form, the third data point was (2000,2000)= 7D0 (hex)=0111 1101 0000 (binary). At step 350, the 9-bit version of this data is generated and stored, namely 250=FA (hex)=0000 1111 1010.

At step 360, this 9-bit version of the third data point (250) is compared to the 9-bit version of the second data point (375). At step 360, the difference is (375−250)=125. Since this differential cannot be encoded or stored using only 4-bits, 8-bits are required, and at step 370 E=1. Thus, the position differential that is encoded and stored using eight-bits is (125,125 decimal)=(7D,7D hex)=(1111101,1111101 binary), reflecting the difference between the third data point and the second data point. Since E=1 for this differential as well as the start point to second data point differential, the present run can continue.

The above steps are repeated for all data points until a new run condition is required, for example by occurrence of an event within step 330. Referring to step 330, in the preferred embodiment, conditions other than a pendown status (step 330-1) can initiate a new run. For example, at step 330-2, if an existing run is observed to be too long, a new run commences with a new high resolution starting point. By definition, a "too long" run is defined in the preferred embodiment as a current run whose length exceeds 10-bits, denoted L0, L1, . . . L9 in FIG. 5. Other run lengths could instead be used, however. Step 330-3 can start a new run when the E-bit changes from 0 to 1, e.g., when 4-bit encoding cannot be used.

As a run terminates and before the next run commences, as recognized by step 330, it is possible for step 390 to update the bits representing the start block length field. Updating is carried out preferably by software 95, which is executed by CPU 60. In FIG. 5, the field length bits are denoted L0, L1, . . . L9, and preferably reflect a run length of not more than ten bits. At step 400, the compressed data stream is exported, preferably using the start block format shown in FIG. 5. The compressed data stream may be stored, or exported to a host system 80, or otherwise used. Although compression preferably is carried out in realtime, exporting may be deferred if desired or necessary, e.g., the data linkage may be occupied with other traffic.

It will be appreciated from the foregoing description that the reduction in resolution at step 350 has the effect of melding together data points that are sufficiently close. Sufficiently close pixels are essentially mapped into a single pixel point in a reduced resolution envelope. For example, raw incoming data in 12-bit format represents 4096×4096 pixel information, whereas data reduced at step 350 to 9-bits represents only 512×512 pixels, while data reduced at step 350 to 8-bits represents only 256×256 pixels.

Note that compression with reduced resolution data has the effect of shifting the entire signature to a new starting position upon decompression. Decompression preferably is carried out in the reverse order of compression. This is tantamount to a different (X,Y) start location, for example as seen on the LCD screen of a device 10. However, the form of the recovered or uncompressed signature will not be distorted because points in a run are encoded with respect to the run starting point and incrementally, with respect to each other. Upon decompression, the initial 12-bit resolution, equivalent to 4096×4096 pixels, may be recovered without loss.

In practice, typical signatures comprise data points that are closely spaced so as produce may consecutive differentials at step 380 that are encodable with 4-bits, with large runs frequently being produced. Such results advantageously permit storing a great deal of differential data with substantially less memory than would be required to store each full data point in the signature data. This in turn promotes good compression without meaningful data loss.

The differential position data are encoding used a number of bits determined at step 360. As noted, the number of bits can be changed on-the-fly, during compression encoding. Finally, at step 390, the real-time compressed data stream is exported, e.g., via link 90 to host system 80.

As noted, FIG. 5A depicts a preferred 32-bit or 4-byte start block or packet format used to store encoded compressed data at the start of each run, according to the present invention. A first P bit signals pen-up/pen-down status. A run length of up to 10 bits (L0–L9) follows, as well as an E bit that indicates whether 4-bit or 8-bit encoding is being used within the present run. Next follow up to 10-bits of initial Y-axis pixel data (Y0–Y9), and up to 10-bits of initial X-axis pixel data X0–X9.

The L0–L9 field requires updating before initiating a new run because it is unknown in realtime just how long the length of the run that follows a start block will be. As noted, a new run is commenced with every new pen-up condition, or if the current run length exceeds a predetermined length (e.g., 1024 pixels or 10 bits), or if the currently calculated differential data cannot be encoded using 4-bit resolution. All of the above conditions are preferably regulated by software or firmware 75, which updates appropriate memory conditions within storage 70-2 (or other storage) before exporting the compressed data stream. FIGS. 5B and 5C depict, respectively, the start block for the exemplary data described, and the initial bytes in the data run, the compressed pattern being 80, 1F, A3, F8, 7D, 7D, 7D, 7D, . . . (hex).

Using 10-bit starting position resolution at method step 340 produces lossless compression but with a somewhat degraded compression ratio compared to the use of 9-bit compression. However, 9-bit resolution ata step 340 produces some distortion in the uncompressed signature data compared to 10-bit resolution. Table 1 compares compression using the present invention to previous compression techniques used by PenWare with signature data collection devices. The 9-bit and 8-bit column headings refer to resolution at method step 350.

TABLE 1

| File Name | Orig'l File Size | Comp'd Size Prior Art | Ratio Prior Art | 9-bit Comp'n | Ratio 9-bit | 8-bit Comp'n | Ratio 8-bit |
|---|---|---|---|---|---|---|---|
| a.sig | 776 | 105 | 7.39 | 192 | 4.0 | 144 | 5.38 |
| ap.sig | 2212 | 396 | 5.58 | 694 | 3.18 | 558 | 3.96 |
| ap2.sig | 2512 | 402 | 6.24 | 695 | 3.6 | 560 | 4.48 |
| ap3.sig | 1916 | 355 | 5.397 | 681 | 2.81 | 502 | 3.81 |
| hor.sig | 1140 | 46 | 24.78 | 192 | 5.93 | 160 | 7.125 |
| sej.sig | 2832 | 457 | 6.19 | 830 | 3.41 | 656 | 4.31 |
| v4.sig | 1252 | 162 | 7.72 | 279 | 4.488 | 268 | 4.67 |
| vert.sig | 644 | 58 | 11.1 | 139 | 4.63 | 130 | 4.95 |

In Table 1, columns one and two are the name and uncompressed size of various files used to test the present invention against a prior art compression technique employed by assignee PenWare (data for which appears at columns three and four). For example, for the first row, a 716 bit long "a.sig" file was compressed down to 105 bits using the prior art compression method, a compression ratio of 7.39:1. But distortion in the uncompressed recovered data could be troublesome. The same a.sig file was reduced down to 192 bits using 9-bit resolution according to the present invention, which provided a lossless compression ratio of 4:1. The same a.sig file was compressed down to 144 bits using 8-bit resolution according to the present invention, a compression ratio of 5.38:1.

While higher compression ratios were attainable with the prior art method, superior recovered or uncompressed data was attained using the present invention. Understandably, while 9-bit resolution at method step 350 provides higher quality decompressed data than does 8-bit resolution, even 8-bit resolution provides superior recovered data compared to the prior art compression technique used.

Applicants' above-described no-loss compression method exploits the above-noted characteristic of signature data. A run of signature points, i.e. signature points between two successive pen-ups or equivalent, typically lie close to each other in terms of (x,y) coordinates, and thus can be coded with respect to each other. Thus, rather than store full 4 byte point information, the present invention stores the incremental difference between successive signature points, using less than 4 bytes of memory. No points are discarded except duplicate points, including points that by virtue of using less than high resolution for differential data are mapped to be identical points. As shown by Table 1 above, acceptably good compression ratios result, with no data loss upon decompression.

Modifications and variations may be made to the disclosed embodiments without departing from the subject and spirit of the invention as defined by the following claims.

What is claimed is:

1. A method for losslessly compressing data representable in (x,y) position coordinates associated with a run status signal, the method comprising the following steps:

(a) when said run status signal is active, receiving start $(x_0,y_0)$ position data in a high resolution format;

(b) reducing said start $(x_0,y_0)$ position data to a lower first resolution format and storing a first resolution format version of said start $(x_0,y_0)$ position data;

(c) reducing said first resolution format version of said start $(x_0,y_0)$ position data to a lower common resolution format and storing a lower common resolution format of said start $(x_0,y_0)$ position data;

(d) for $(x_i, y_i)$ position data subsequent to said start $(x_0,y_0)$ position data, reducing such subsequent positional data to said lower common resolution format and storing a lower common resolution format of said subsequent positional data;

(e) within a run of z data points, calculating and storing a differential between adjacent position data $(x_i,y_i)$ and $(x_{i+1},y_{i+1})$ where $0 \leq i \leq z$;

(f) determining for each said differential calculated at step (e) whether said differential is encodable in M-bits or in N-bits, where M<N, and encoding said differential in M-bits if possible, and in N-bits otherwise;

(g) repeating steps (e) through (f) for subsequent position data within said run; and (h) upon completion of said run, exporting a compressed data stream that includes differentials encoded at step (f).

2. The method of claim 1, wherein an active said run status signal denotes a pen-down status of a pen in a signature capture system.

3. The method of claim 1, wherein at step (e), said run is defined by at least one occurrence selected from a group consisting of:

(i) an active run status signal, (ii) a length of successive position data not exceeding a predetermined length, and (iii) an inability at step (f) to continue to encode said differential using M-bits.

4. The method of claim 1, wherein at step (a) said high resolution format is at least 10-bits.

5. The method of claim 1, wherein at step (b) and step (c) said lower common resolution format is a format selected from a group consisting of (i) 10-bits, and (ii) 9-bits.

6. The method of claim 1, wherein at step (f), M=4 and N=8.

7. The method of claim 3, wherein said predetermined length is 10-bits.

8. The method of claim 1, wherein at step (h) said data stream includes a start block packet including at least one element selected from a group consisting of (i) at least one data bit signalling said run status, (ii) a number L bits indicating length of said run, (iii) at least one bit indicating whether M-bit or N-bit encoding is used at step (f), (iv) starting x-axis coordinate position data in said high resolution format, and (v) starting y-axis coordinate position data in said high resolution format.

9. The method of claim 1, wherein step (h) includes updating a field in said exported data stream representing length of said run.

10. The method of claim 1, wherein step (h) includes updating a field in said exported data stream representing length of said run, said field being updated upon an occurrence of any event selected from a group consisting of:

(i) an active run status signal, (ii) a length of successive position data not exceeding a predetermined length, and (iii) an inability at step (f) to continue to encode said differential using M-bits.

11. A method for losslessly compressing signature data representable in (x,y) position coordinates associated with a run status signal that is active when a pen writes said data and is inactive otherwise, the method comprising the following steps:

(a) when said run status signal is active, receiving start $(x_0,y_0)$ position data in a high resolution format of at least 10-bits;

(b) reducing said start $(x_0,y_0)$ position data to a lower first resolution format, selected from a group consisting of 10-bits and 9-bits, and storing a first resolution format version of said start $(x_0,y_0)$ position data;

(c) reducing said first resolution format version of said start $(x_0,y_0)$ position data to a lower common resolution format, selected from a group consisting of 9-bits and 9-bits, and storing a lower common resolution format of said start $(x_0,y_0)$ position data;

(d) for $(x_i, y_i)$ position data subsequent to said start $(x_0,y_0)$ position data, reducing such subsequent positional data to said lower common resolution format and storing a lower common resolution format of said subsequent positional data;

(e) within a run of z data points, calculating and storing a differential between adjacent position data $(x_i,y_i)$ and $(x_{i+1},y_{i+1})$ where $0 \leq i \leq z$;

(f) determining for each said differential calculated at step (e) whether said differential is encodable in 4-bits or in 8-bits, encoding said differential in 4-bits if possible, and in 8-bits otherwise;

(g) repeating steps (e) through (f) for subsequent position data within said run; and (h) upon completion of said run, exporting a compressed data stream that includes differentials encoded at step (f).

12. The method of claim 11, wherein at step (e), said run is defined by at least one occurrence selected from a group consisting of:
(i) an active run status signal,
(ii) a length of successive position data not exceeding a predetermined length, and
(iii) an inability at step (f) to continue to encode said differential using 4-bits.

13. The method of claim 11, wherein at step (h) said data stream includes a start block packet including at least one element selected from a group consisting of (i) at least one data bit signalling said run status, (ii) a number L bits indicating length of said run, (iii) at least one bit indicating whether M-bit or N-bit encoding is used at step (f), (iv) starting x-axis coordinate position data in said high resolution format, and (v) starting y-axis coordinate position data in said high resolution format.

14. The method of claim 13, wherein L=10.

15. The method of claim 11, wherein step (h) includes updating a field in said exported data stream representing length of said run, said field being updated upon an occurrence of any event selected from a group consisting of:
(i) an active run status signal,
(ii) a length of successive position data not exceeding a predetermined length, and
(iii) an inability at step (f) to continue to encode said differential using 4-bits.

16. A signature capture device, comprising:
a touch pad unit that generates digital (x,y) position coordinate information responsive to contact with a pen;
a processor unit coupled to receive said position coordinate information and to provide a run status signal that is active when said pen contacts a surface of said touch pad unit;
memory storing a routine, executable by said processor unit, for losslessly compressing signature data representable in said (x,y) position coordinate information; and an output port through which said losslessly compressed signature data may be exported;

said routine, when executed by said processor unit, carrying out the following steps:

(a) when said run status signal is active, receiving start $(x_0,y_0)$ position data in a high resolution format;

(b) reducing said start $(x_0,y_0)$ position data to a lower first resolution format and storing a first resolution format version of said start $(x_0,y_0)$ position data;

(c) reducing said first resolution format version of said start $(x_0,y_0)$ position data to a lower common resolution format and storing a lower common resolution format of said start $(x_0,y_0)$ position data;

(d) for $(x_i, y_i)$ position data subsequent to said start $(x_0,y_0)$ position data, reducing such subsequent positional data to said lower common resolution format and storing a lower common resolution format of said subsequent positional data;

(e) within a run of z data points, calculating and storing a differential between adjacent position data $(x_i,y_i)$ and $(x_{i+1},y_{i+1})$ where $0 \leq i \leq z$;

(f) determining for each said differential calculated at step (e) whether said differential is encodable in M-bits or in N-bits, where M<N, and encoding said differential in M-bits if possible, and in N-bits otherwise;

(g) repeating steps (e) through (f) for subsequent position data within said run; and (h) upon completion of said run, exporting a compressed data stream that includes differentials encoded at step (f).

17. The signature capture device of claim 16, wherein at step (e), said run is defined by at least one occurrence selected from a group consisting of:
(i) an active run status signal,
(ii) a length of successive position data not exceeding a predetermined length, and
(iii) an inability at step (f) to continue to encode said differential using M-bits.

18. The signature capture device of claim 16, wherein at step (h) said data stream includes a start block packet including at least one element selected from a group consisting of (i) at least one data bit signalling said run status, (ii) a number L bits indicating length of said run, (iii) at least one bit indicating whether M-bit or N-bit encoding is used at step (f), (iv) starting x-axis coordinate position data in said high resolution format, and (v) starting y-axis coordinate position data in said high resolution format.

19. The signature capture device of claim 16, wherein said device has at least one characteristic selected from a group consisting of:
at step (a) said high resolution format is at least 10-bits; and
at steps (b) and (c) said lower common resolution format is selected from a group consisting of (i) 10-bits, and (ii) 9-bits.

20. The signature capture device of claim 16, wherein a run has a predetermined length of 10-bits, and at step (f), M=4 and N=8.

* * * * *